Oct. 2, 1962 C. C. RAYBURN 3,056,939

COMPONENT LEAD-LOCKING ARRANGEMENT

Filed July 26, 1960

INVENTOR.
Charles C. Rayburn
BY
[signature]
ATT'Y.

United States Patent Office 3,056,939
Patented Oct. 2, 1962

3,056,939

COMPONENT LEAD-LOCKING ARRANGEMENT

Charles C. Rayburn, Alexandria, Va., assignor to Illinois Tool Works, Inc., a corporation of Delaware Filed July 26, 1960, Ser. No. 45,323
6 Claims. (Cl. 339—17)

This invention relates in general to a component lead-locking arrangement and, more particularly, relates to means for locking an electrical component to a circuit board prior to soldering thereof.

For the past several years, the use of printed circuits on panel boards has been coming into greater and greater use. In printed circuit boards, the electrical circuit is generally formed by suitable deposition of an electrically conductive substance upon an insulating type of board. Various components are assembled in holes in the circuit board to form a part of a complex circuitry network of many and varied uses. One common usage of printed circuit boards is in the communications field, such as for use in radios and television sets.

Since many components are often assembled to a single circuit board, it is apparent that they are not all assembled thereto simultaneously. The general procedure is to assemble the separate components to the circuit board in a one-by-one fashion and after all are assembled thereto, a soldering operation to firmly fix the components on the board, as well as to make the desired electrical connections, is generally accomplished by automatic machinery. The following problems have been noted relative to the assembling of components to the circuit board prior to and during the soldering operation, namely (*a*) components are often dislodged from the board while other components are being assembled to the board; (*b*) components often become tilted and/or elevated from the mounting in the holes when slapped by the soldering surface of the automatic machinery which solders the components of the circuit board; and (c) immediately subsequent to the actual soldering of the components upon the board in the automatic soldering apparatus, the movement of the board from the soldering station for subsequent processing involves mass in motion problems or vibration problems such that the component lead may move in the holes while the solder joints are solidifying thereby producing a poor soldered joint. There have been some prior art attempts to avoid the problems abovenoted, which have not been commercially feasible in solving these problems in an economical repetitive manner. One attempt at solving the problems has been to swage straight depending leads from the electrical component with a long taper. The leads are generally made of wires of predetermined diameter, and thus, a slight variation in the width of the swage, in the diameter of the wire, or in the hole sizes cause the overall component height to be unpredictable. Further, a slight variation in the insertion pressure of the component often causes a height to be changed even though the parts and the holes are held to very close tolerances.

It is the general object of this invention to provide a temporary lead-locking arrangement for attachment in the electrical component to a circuit board which involves a swaging operation which is easy to manufacture and overcomes the aforenoted prior art problems.

It is another object of this invention to provide a component lead-locking arrangement which is easy to insert in a circuit panel board, and maintains a repetitive constant height dimension of the component above the circuit board to which the component is temporarily locked.

It is a further object of this invention to provide a component lead which, due to the special configuration and its method of manufacture, as well as the manner of attachment of the lead to the electrical component, affords an exceptionally strong lead as compared to prior art leads.

The novel features that are characteristic of the invention are set forth with particularity in the appended claims. The invention itself, however, both as to its organization in the method of operation, together with additional objects and advantages thereof will be best understood by the following description of specific embodiments when read in connection with the accompanying drawings, in which:

Figure 1:
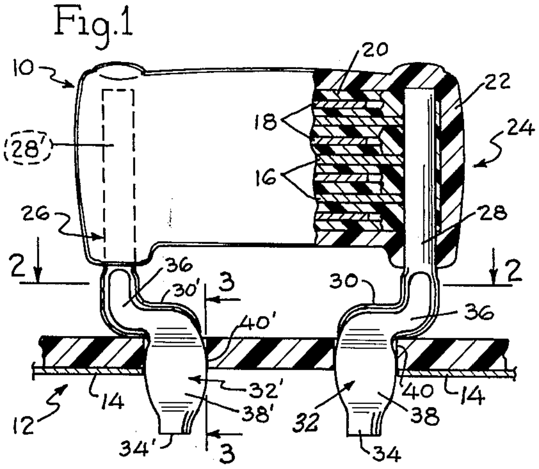
FIG. 1 is a plan view, partially in section, showing in a somewhat enlarged scale, a preferred embodiment of lead-locking arrangement for an electrical component.
Figure 2:
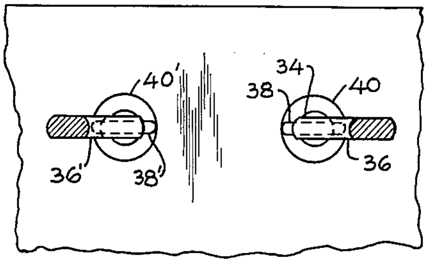
FIG. 2 is a sectional view along lines 2—2 of FIG. 1.
Figure 3:
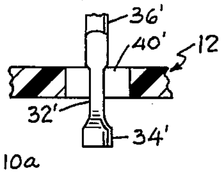
FIG. 3 is a sectional view along lines 3—3 of FIG. 1.
Figure 6:
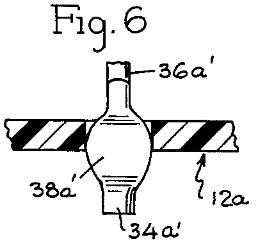
FIG. 6 is a sectional view along lines 6—6 of FIG. 4.

As shown in FIG. 1 of the drawings, an electrical component 10 is shown in the form of a roll capacitor mounted on an electrical circuit panel board 12 having metalized electric circuit portions 14 deposited on one side thereof in a conventional manner, said circuit board preferably being made of insulating material.

The interior of the component 10 is preferably formed in the manner disclosed in my copending application Serial No. 756,121, filed August 20, 1958, now Patent No. 3,040,415, and entitled "Wound Capacitor." As disclosed in that application, the capacitor per se is formed of alternate convolutely wound films 20 of suitable plastic materials, such as Milar having electrode foil means 16 and 18 interposed therebetween in spaced relation, the leads 24—26 per se being attached to the end surfaces of the metal electrode foils, such as 16, by heating up the lead 24 and melting the insulating or dielectric tapes 20 so as to cause a tight compression engagement of the lead with the electrode foils. The other electrode foil 18 is similarly attached to the other lead 26 in a mirror image relationship. To add further strength to the capacitor body and in some applications where a complete hermetic seal is required, a further insulation body, such as a suitable epoxy-wax resin material 22 is surroundingly disposed to the capacitor body as shown.

The leads 24 and 26 are conveniently formed on the components in the depending relation and each have an essentially straight portion 28—28′ vertically aligned with the panel boards 12. The leads 26 and 28 at their point of attachment to the component 10 are preferably spaced apart a greater dimension than the center lines of the two apertures 40—40′.

The leads 24—26 are substantially mirror images of each other and I will describe one lead only, the same numbers being applied to the other lead with the numbers primed. Immediately below the straight portion 28—28′ of the individual leads are offset portions 30—30′ which are directed generally toward each other, the bottom surfaces thereof providing a panel engaging surface which maintains the dimensional height stability of the component in its mounting on the panel board. An aperture engaging portion 32—32′ extends outwardly through the aperture 40—40′ and terminates in an entering end portion 34. It is preferable that the portion 32 be swaged or enlarged to a dimension just slightly larger than the diameter of the apertures 40—40′. The substantially flat opposed surfaces 38 are thus formed and margins bounding these surfaces provide a temporary lead-locking arrangement for the component.

Immediately above portion 38, it will be noted that the angularly offset portion 30 and a short dimension on the lower end of the straight portion 28 of the lead is also swaged. This provides a more or less flat surface 36. The swaging of the right-angled bend to form portion 36 materially strengthens the terminal leads and greatly aids in resisting the bending thereof so as to maintain the dimensional stability of the lead wires after they have been formed prior to the assembling operation.

It has been found that the combination of the attachment of the straight portion 28 to the electrode foils, such as 18 and 20 by the compression cooling of the plastic film 20 around the wire along with the additional strength imparted by the outside covering 22 and together with the swaging of the lead in the upper portion above the panel board, affords an exceedingly strong and stable lead wire connection means. Thus the components are well adapted for temporarily locking the component to the panel board prior to the automatic soldering thereof and while the soldering is cooling.

Figure 4:
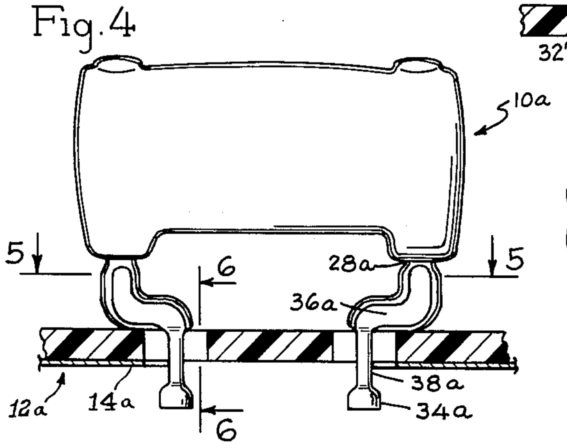
FIG. 4 is a view similar to FIG. 1 of an alternate embodiment of lead-locking arrangement.
Figure 5:
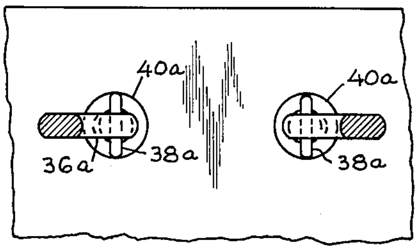
FIG. 5 is a sectional view along lines 5—5 of FIG. 4.

The embodiment shown in FIG. 4 of the drawings is substantially similar to that of above-described and similar parts will be identified with similar reference numerals with the addition of the suffix "*a*." As shown in FIG. 4, the essential change is that the lead-locking component portion 38*a* has been turned transversely to the portion 36*a* so as to provide a little more stability in preventing rotation of the capacitor transversely to its long axis. While this portion 38*a* does aid in this regard, it is at the additional expense of having to swage the material at right angles to the swage portion 36*a* as shown.

Figure 7:
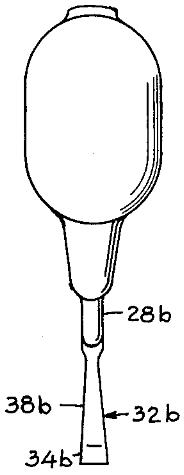
FIG. 7 is an end view of another embodiment of component lead-locking arrangement.
Figure 8:
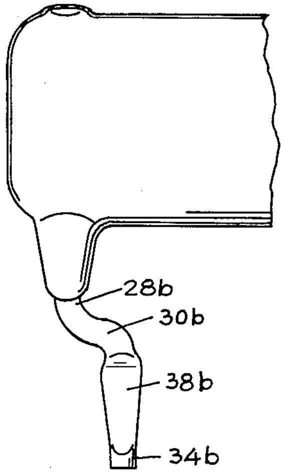
FIG. 8 is a partial front elevational view of the component shown in FIG. 7.

The embodiment shown in FIGS. 7 and 8 is quite similar in many respects to the foregoing and similar parts will be identified with similar reference numerals together with a figure suffix "*b*." In the embodiment shown in FIGS. 7 and 8, the panel engaging portion 30*b* provides dimensional stability and the widened portion 38*b* engages the aperture to temporarily lock the lead in position prior to the soldering operation. In this device the lead is not as strong as in the devices shown in FIGS. 1 and 4 but does provide a lead-locking device which affords a repetitive height type terminal which is slightly easier to manufacture since only one portion of the lead is being swaged.

Having thus described various embodiments of a swaged lead-locking arrangement for electrical components, it is to be understood that the illustrated forms were selected to facilitate the disclosure of the invention rather than to limit the number of forms which the invention may assume. Various modifications, adaptations, and alterations may be applied to the specific form shown to meet the requirements of practice, without in any manner departing from the spirit or scope of the present invention, and all such modifications, adaptations, and alterations are contemplated which may come within the scope of the appended claims.

What is claimed as the invention is:

1. A device for mounting an object to a panel having a surface with a pair of spaced apertures formed therein of substantially the same predetermined size comprising an electrical component having a major dimension disposed substantially parallel with said panel and spaced opposite end portions disposed transverse to said panel having a pair of depending electrical lead members each having a substantially straight first portion each traversing an opposite end portion of said component and extending therebelow and strongly fastened thereto in electrical engagement therewith, each lead member having a panel surface engaging portion angularly offset relative to said first portion and extending generally towards each other to maintain said object a predetermined and constant distance above said panel, each of said lead members having an entering end portion, and an aperture engaging portion disposed intermediate said entering end portion and angularly offset portion, said aperture engaging portion being formed so as to taper to a dimension substantially wider in one cross-sectional dimension than said entering end portion and substantially narrower than said entering end portion in another cross-sectional dimension taken at right angles to said first cross-sectional dimension, the edge surfaces bounding the wider dimension being adapted to engage the margins of one of said apertures to retain the object in said apertures.

2. The device set forth in claim 1 wherein said electrical lead members are initially substantially constant diameter wires and said aperture in said panels are bores having a greater diameter than the diameter of said wires.

3. The device set forth in claim 2 wherein said angularly offset portion and a portion of said first portion are strengthened by swaging near the juncture thereof to afford a dimensionally stable article prior to assembly to the panel.

4. The device set forth in claim 3 wherein said aperture engaging portion is also swaged and to a greater degree than portions adjacent the juncture of said first and angularly offset portions.

5. The device set forth in claim 4 wherein said swaged aperture engaging portions form opposed substantially opposite flat surfaces, said flat surfaces being disposed substantially parallel to opposed flat surfaces formed by the swaged juncture of said portion of said first portion and said angularly offset panel engaging portion.

6. An article of manufacture for attaching an electrical component to a printed circuit board panel prior to soldering thereof, said panel having a top and bottom surface one of which has an electric circuit printed thereon and a pair of spaced bores formed therethrough of substantially the same predetermined diameter, said spaced bores being arranged to be adjacent to different portions of said electric circuit, comprising a component having a pair of terminal wires having a first substantially straight portion electrically and physically attached to said component, and traversing the end surfaces thereof and having a portion extending therebelow in generally depending relation, said depending portion adjacent said component being spaced apart a greater dimension than the dimension between the centers of said apertures, each of said terminal wires having a second portion connected to said first portion and extending generally toward each other and adapted to engage a surface of said panel, an entering end portion spaced from said second portion and at right angles thereto, and an intermediate portion connecting said entering end and second portions, said intermediate portion having one cross-sectional dimension less than said predetermined diameter and a second cross-sectional dimension tapering from adjacent said entering end from a dimension less than said pre-determined diameter to a dimension slightly greater than said predetermined diameter adapted to impart stability in mounting said component prior to soldering thereof.

References Cited in the file of this patent

UNITED STATES PATENTS

| | | |
|---|---|---|
| 582,462 | Dickerson | May 11, 1897 |
| 878,740 | Newman | Feb. 11, 1908 |
| 2,587,568 | Eisler | Feb. 26, 1952 |
| 2,754,486 | Hathorn | July 10, 1956 |
| 2,830,698 | Coda et al. | Apr. 15, 1958 |
| 2,892,178 | Harris | June 23, 1959 |
| 2,922,138 | Comins | Jan. 19, 1960 |
| 2,966,654 | Hubbell et al. | Dec. 27, 1960 |
| 2,994,057 | Donohue et al. | July 25, 1961 |